United States Patent
Sadowy et al.

(10) Patent No.: US 6,831,526 B2
(45) Date of Patent: Dec. 14, 2004

(54) PHASE AND AMPLITUDE DIGITAL MODULATION CIRCUIT AND METHOD

(75) Inventors: Jerome Sadowy, Mirande (FR); Cyrille Boulanger, Toulouse (FR); Jean-Claude Lalaurie, Escalquens (FR); Luc Lapierre, Toulouse (FR)

(73) Assignee: Centre National d'Etudes Spatiales (C.N.E.S.), Paris (FR)

( * ) Notice: Subject to any disclaimer, the term of this patent is extended or adjusted under 35 U.S.C. 154(b) by 8 days.

(21) Appl. No.: 10/332,458

(22) PCT Filed: Jul. 9, 2001

(86) PCT No.: PCT/FR01/02199

§ 371 (c)(1),
(2), (4) Date: Jan. 9, 2003

(87) PCT Pub. No.: WO02/07303

PCT Pub. Date: Jan. 24, 2002

(65) Prior Publication Data

US 2004/0021523 A1 Feb. 5, 2004

(30) Foreign Application Priority Data

Jul. 13, 2000 (FR) .............................................. 0009241

(51) Int. Cl.[7] .............................................. H04L 27/20
(52) U.S. Cl. ...................................... 332/103; 332/105
(58) Field of Search ................................ 332/103, 104, 332/105, 144, 145, 146; 375/279–283, 308

(56) References Cited

U.S. PATENT DOCUMENTS 3,867,574 A  *  2/1975  McIntosh ..................... 375/280

| | | | |
|---|---|---|---|
| 4,994,773 A | 2/1991 | Chen et al. ................. | 333/164 |
| 5,063,361 A | 11/1991 | Smith et al. ................ | 332/102 |
| 5,428,320 A | 6/1995 | Lindberg et al. ............ | 332/105 |
| 5,442,327 A * | 8/1995 | Longbrake et al. ......... | 332/103 |
| 5,463,355 A | 10/1995 | Halloran ..................... | 332/103 |

FOREIGN PATENT DOCUMENTS

FR    2 760 301       9/1998
WO    WO 98/38730    9/1998

OTHER PUBLICATIONS

XP–000435908, IEEE Journal of Solid–State Circuits, Angel Boveda et al., "A 0.7–3 GHz GaAs QPSK/QAM Direct Modulator", pp. 1340–1349.

XP–002046700, A. Primerose et al., "High Bit Rate Four Phase MMIC Remodulation Demodulator and Modulator".

* cited by examiner

Primary Examiner—Robert Pascal
Assistant Examiner—Joseph Chang
(74) Attorney, Agent, or Firm—Young & Thompson

(57) ABSTRACT

A method and a circuit for modulating a carrier signal (Se) with a signal (SCj) having at least a modulation cell (CMi) by phase shift for receiving two digital control signals (Scji, SCji2) representing at least part of the digital modulation signal (SCj). For at least a value of the digital modulation signal (SCj), the method consists in applying on at least a common modulation cell (CMi), two digital control signals (SCji1, SCji2) of identical value, the modulation cell (CMi) delivering a signal, called a modulated elementary signal (Ssi), which is null for the digital modulation signal value (SCj).

18 Claims, 4 Drawing Sheets

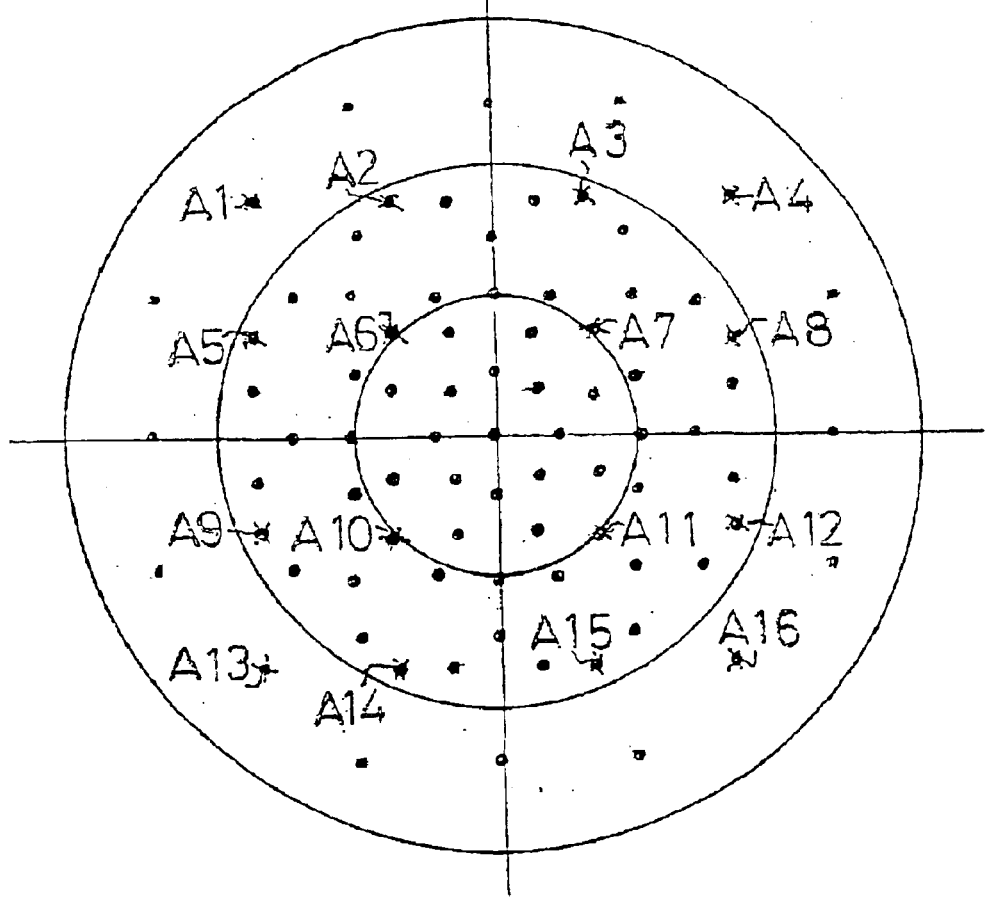

PHASE AND AMPLITUDE DIGITAL MODULATION CIRCUIT AND METHOD

Figure 1:
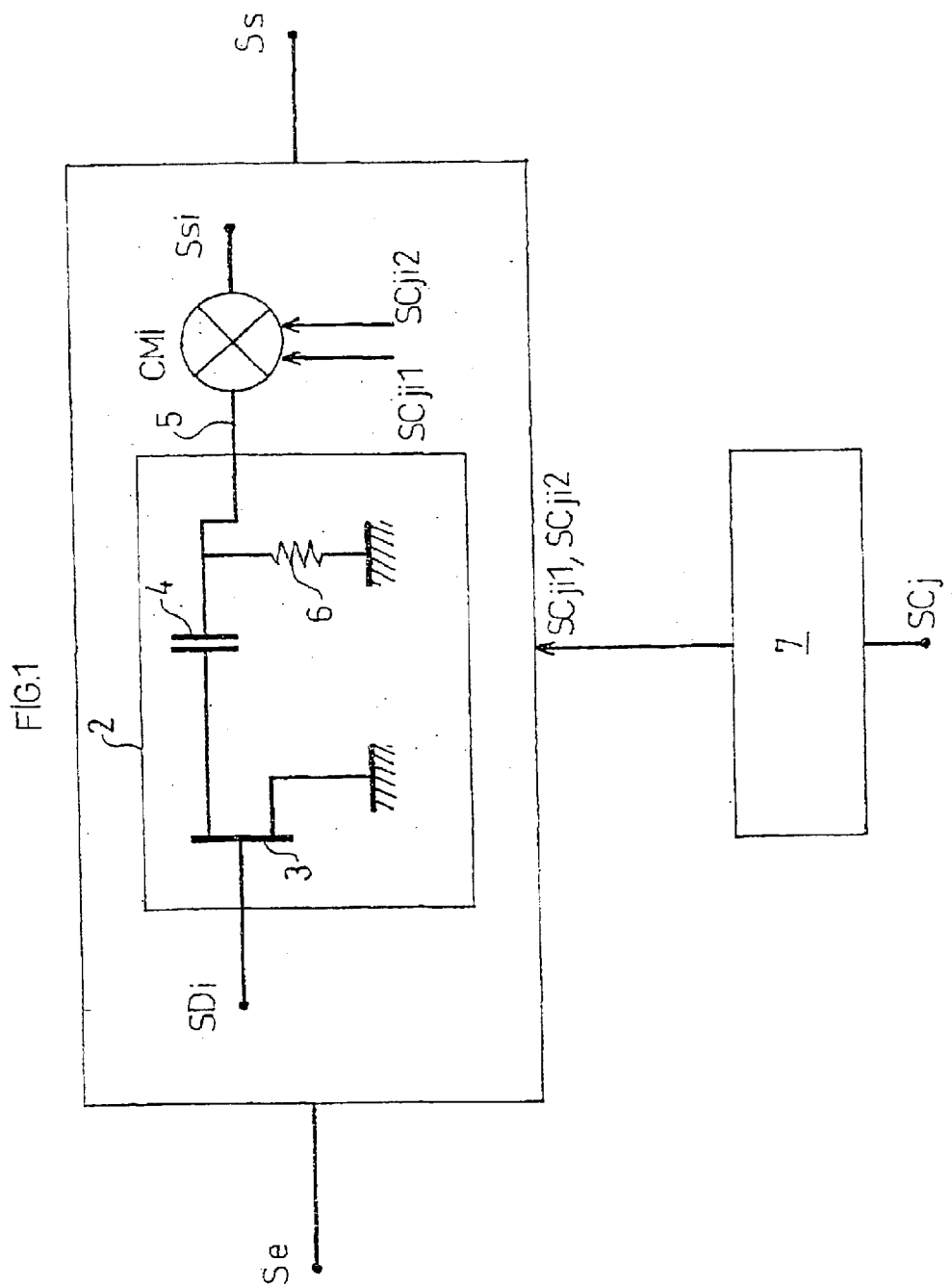

The invention relates to a method for digitally modulating a periodic carrier signal of high frequency—in particular one which may be in the microwave range (a range of frequencies for which propagation phenomena are not negligible)—with a digital modulation signal generally of lower frequency (that to say less than that of the carrier signal), implemented by a modulator circuit comprising at least one modulation cell—in particular a phase-shift keying modulation cell—intended to receive two digital control signals representing at least a part—in particular a component—of the digital modulation signal. It extends to an electronic modulator circuit designed for implementing such a method.

WO-98.38730 describes an electronic phase-shift keying modulator circuit with distributed structure comprising a distribution line with n phase-shift cells, a plurality of n parallel branches extending from each phase-shift cell and each comprising a switching/modulator circuit, and means for adding in phase the signals coming from the switching/modulator circuits. The number of phase states that can be obtained may be greater than the number of branches when these contain, as the switching/modulator circuit, modulation cells which, in the most elementary embodiment, are cells for modulation by phase-shift keying with two phase states (referred to as BPSK or MDP2) which are intended to receive two complementary digital control signals.

The publication BOVEDA et al.: "A 0.7–3 GHZ GAAS QPSK/QAM DIRECT MODULATOR" IEEE JOURNAL OF SOLID-STATE CIRCUITS, Vol. 28, No. 12, 1st Dec. 1993, pp. 1340–1349 also describes other examples of applications of BPSK digital modulation cells for carrying out phase and/or amplitude modulations.

In all the known applications of such cells for BPSK digital modulation with two phase states, as described for example by the publication A. PRIMEROSE et al. "High Bit Rate Four, Phase MMIC Remodulation Demodulator and Modulator" Proceedings of the GAAS 92 European Gallium Arsenide and related III-V Compounds Applications Symposium 27–29, Apr. 1992, NOORDWIJK, the digital control signals applied to these BPSK cells are, by principle, signals with two complementary states I, Ī.

The points in the Fresnel plane (phase and/or amplitude states) that can be addressed in these known digital modulation methods and circuits are therefore limited to a value such as $2^n$ in the case of WO-98.38730.

It has, however, become desirable to be able to increase the number of points in the Fresnel plane (phase and/or amplitude states) for a given circuit structure, in order to improve the performances of the modulation for a given cost price, a given size, a given weight and a given energy consumption.

It is therefore an object of the invention to satisfy this requirement in a simple and economical way. It is a particular object thereof to provide a method and a modulator circuit making it possible to address a large number of points (phase and/or amplitude states) with no loss of consumed power and a low energy consumption, so that this circuit and this method can be adapted and used with numerous types of coding and modulation, in numerous applications.

It is a further object of the invention to provide such a method and such a modulator circuit which are advantageously suited to production in microwave monolithic technology (MMIC)—in particular on gallium arsenide GaAs—with excellent precision.

More particularly, it is an object of the invention to permit a simple choice of the phase and/or amplitude states, and to do so at the very moment of its incorporation into the system (and not during the design or fabrication of the integrated circuit itself).

It is more particularly a further object of the invention to provide such a method and such a modulator circuit which are compatible with the constraints of on-board space systems (small size, excellent reliability, low consumption, etc.).

It is also more particularly an object of the invention to provide such a method and such a modulator circuit which are compatible with high bit rate modulation codings such as MCT, which become advantageous when a large number of phase and/or amplitude states are available.

It is also more particularly an object of the invention to provide such a method and such a modulator circuit which can be adapted to any frequency of carrier signals, in particular in the microwave range.

It is also more particularly an object of the invention to provide such a method and such a modulator circuit which, after production, can accept carrier signals as input whose frequency is fixed but which may also be selected from a wide band (for example from the X band for terrestrial observation telemetry, from the K band of multimedia telecommunication satellites, etc.).

It is a further object of the invention to provide a modulation which does not produce substantial perturbations of the line and of the input signal.

To that end, the invention relates to a method for modulating a carrier signal with a digital modulation signal of lower frequency, implemented by a modulator circuit comprising at least one modulation cell intended to receive two digital control signals representing at least a part of the digital modulation signal, wherein, for at least one value of the digital modulation signal, two digital control signals of equal value are applied to at least one given modulation cell. This modulation cell then delivers, for this value of the digital modulation signal (for which the digital control signals have the same value), a signal, referred to as a modulated elementary signal, which is different in amplitude and/or in phase—in particular which is zero—from that which it delivers when the digital control signals are complementary.

The invention also extends to a circuit designed for implementing the method according to the invention. It therefore also relates to a modulator circuit capable of modulating a carrier signal with a digital modulation signal of lower frequency, comprising at least one modulation cell intended to receive two digital control signals representing at least a part of the digital modulation signal, wherein it is designed so that, for at least one value of the digital modulation signal, at least one given modulation cell receives two digital control signals of equal value.

At least one modulation cell may be of the type with amplitude modulation using a single phase state. Nevertheless, advantageously, and according to the invention, at least one modulation cell is a phase-shift keying modulation cell, the method and the circuit according to the invention carrying out digital modulation at least by phase-shift keying.

Each modulation cell may be a cell for modulation by phase-shift keying of the type with two phase states (referred to as a BPSK or MDP2 cell)—in particular in opposition—generally having a single amplitude state, but also possibly having two amplitude states. By applying digital control signals of equal value to it, it is given one or two additional phase and/or amplitude state(s). In the event that the phase difference between two states is other than 180°, and/or in the event that the amplitude of the two states is different, the said modulation cell does not deliver the same modulated elementary signal when the digital control signals that it receives are equal to 0 and when they are equal to 1. Two additional states are hence created for this modulation cell. This modulated elementary signal is not necessarily zero when the digital control signals are of equal value (both equal to 0 or to 1).

Preferably, advantageously and according to the invention, at least one modulation cell receiving two digital control signals of equal value for at least one value of the digital modulation signal is nevertheless designed to deliver a signal, referred to as a modulated elementary signal, which is zero for this value of the digital modulation signal.

Advantageously and according to the invention, at least one modulation cell is furthermore designed to deliver a modulated elementary signal with two phase states in opposition and a single amplitude state when it receives complementary digital control signals, and to deliver a modulated elementary signal which is zero when it receives digital control signals of equal value.

In a method and a circuit according to the invention, each BPSK modulation cell thus delivers a modulated signal that can have three or four distinct values—in particular when one of them is the value zero—, rather than only two values as in the case of a traditional BPSK cell. The various modulated elementary signals of the various modulation cells are combined—in particular added in phase—in order to form the modulated output signal. It is hence possible to address a larger number of points in the Fresnel plane.

Advantageously, a method according to the invention is one wherein the modulator circuit comprises at least two modulation cells, and wherein, for at least one value of the digital modulation signal, two digital control signals of equal value are applied to at least one modulation cell (this modulation cell preferably delivering a modulated elementary signal which is zero for this value of the digital modulation signal) and two digital control signals of complementary values are applied to at least one other modulation cell (this other modulation cell delivering a modulated elementary signal which is non-zero for this value of the digital modulation signal).

In particular, in the preferred variant of the invention, for a given value of the digital modulation signal, at least one modulation cell delivers a zero modulated elementary signal while at least one other delivers a non-zero modulated elementary signal.

Advantageously, a method according to the invention is also one wherein, for at least one value of the digital modulation signal, two digital control signals of equal value are applied to at least one modulation cell, and wherein, for at least one other value of the digital modulation signal, two digital control signals of complementary values are applied to this (these) modulation cell(s). In particular, a given modulation cell hence does not deliver a zero modulated elementary signal for all the values of the digital modulation signal.

Advantageously and according to the invention, for each modulation cell with two phase states in opposition, when they are of equal value, the digital control signals applied to a given modulation cell are both equal to 0. This avoids the drifts due to technological imperfection of the electronic circuit which would not cancel out the modulated elementary signal perfectly for two digital control signals equal to 1.

Furthermore, traditional BPSK modulation cells (such as those described by WO-98.38730 (FIG. 7) or by the publication A. PRIMEROSE et al. cited above) are impedance-matched well when they receive control signals with complementary states. Nevertheless, such is not the case if the control signals simultaneously take the same value, and in particular when they both take the value 0, especially in the microwave range. However, the inventors have determined that it is actually possible to provide impedance matching means such that the impedance is in practice matched sufficiently for the control signals to be complementary or equal, in so far as the drifts entailed by the impedance matching error are less than, or of the same order as, the technological tolerances.

Advantageously and according to the invention, an input signal coming from the carrier signal is thus delivered to each modulation cell via impedance matching means, which are designed so that the modulation cell is at least substantially impedance-matched both when the digital control signals that it receives are complementary and when they are equal. Advantageously and according to the invention, the impedance matching means comprise, for each modulation cell, a transistor, which receives the input signal and is connected to the modulation cell, and a parallel resistor between the transistor and ground.

Advantageously and according to the invention, a modulator circuit is furthermore used with a distributed structure comprising a plurality of derived branches, each comprising at least one modulation cell intended to receive two digital control signals, each derived branch delivering a signal referred to as a modulated branch-output signal, and the modulated branch-output signals coming from the various derived branches are added in phase in order to form a modulated output signal. In particular, a modulator circuit according to the distributed structure described in WO/98.38730 is used. In the method of the invention, the number of phase states of each BPSK modulation cell is equal to 3 rather than 2, which makes it possible to address $3^n$ points in the Fresnel plane with the modulated output signal, n being the number of branches of the circuit (and not $2^n$ as in WO/98.38730).

The invention extends to a modulator circuit, wherein it is designed for implementing the aforementioned features of the method according to the invention. In particular, a circuit according to the invention advantageously comprises, upstream of each modulation cell, impedance matching means which supply the modulation cell with an input signal coming from the carrier signal and which are designed so that the modulation cell is at least substantially impedance-matched both when the digital control signals that it receives are complementary and when they are equal.

The invention also relates to a method and to a modulator circuit wherein there are all or some of the features mentioned above or below in combination.

Figure 2:
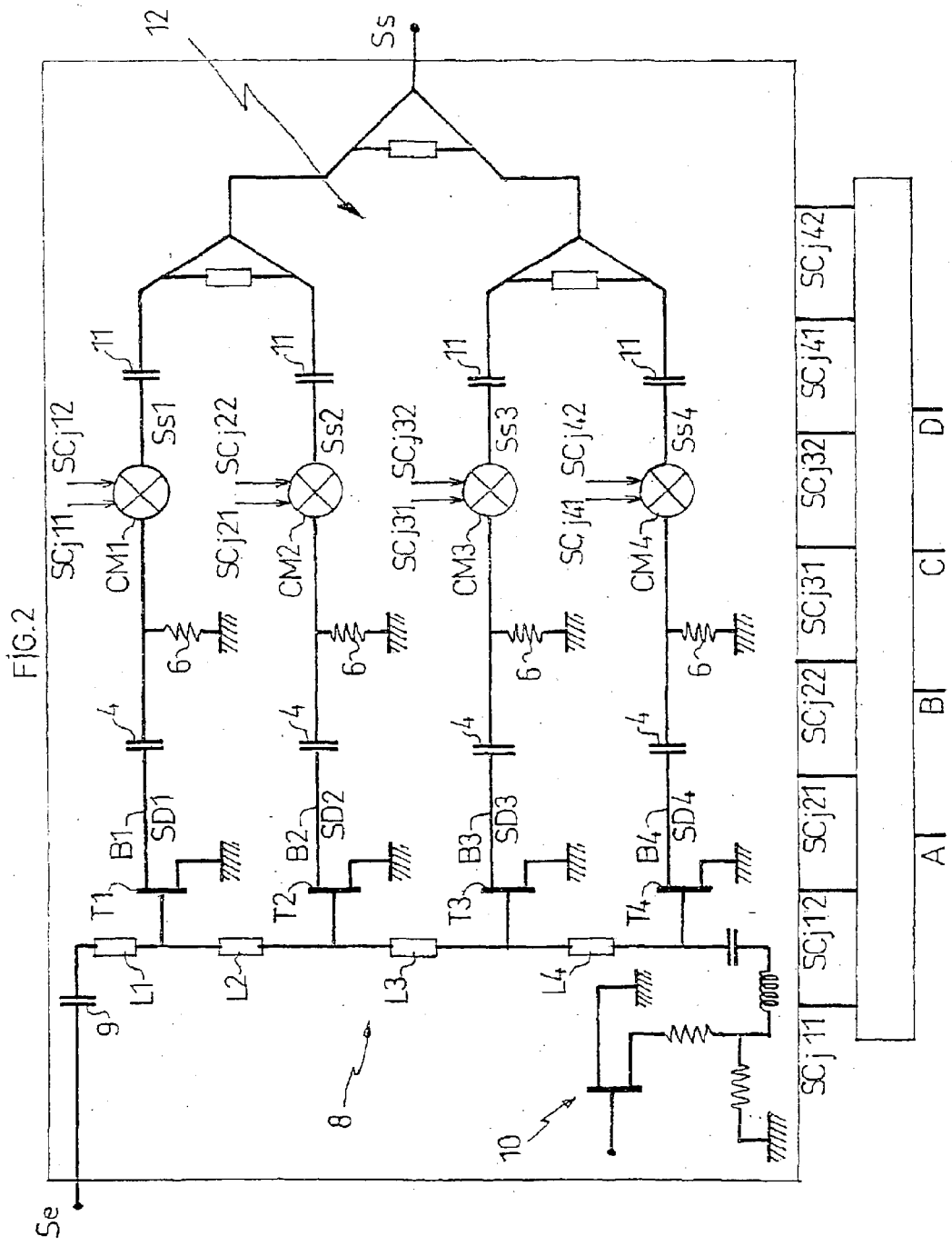
Figure 4:
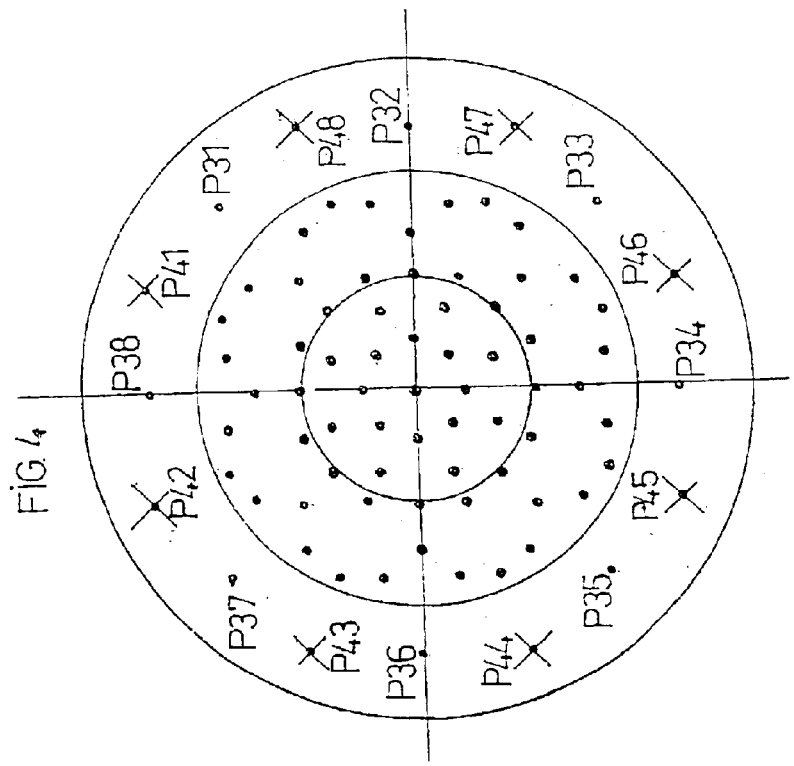
Figure 3:
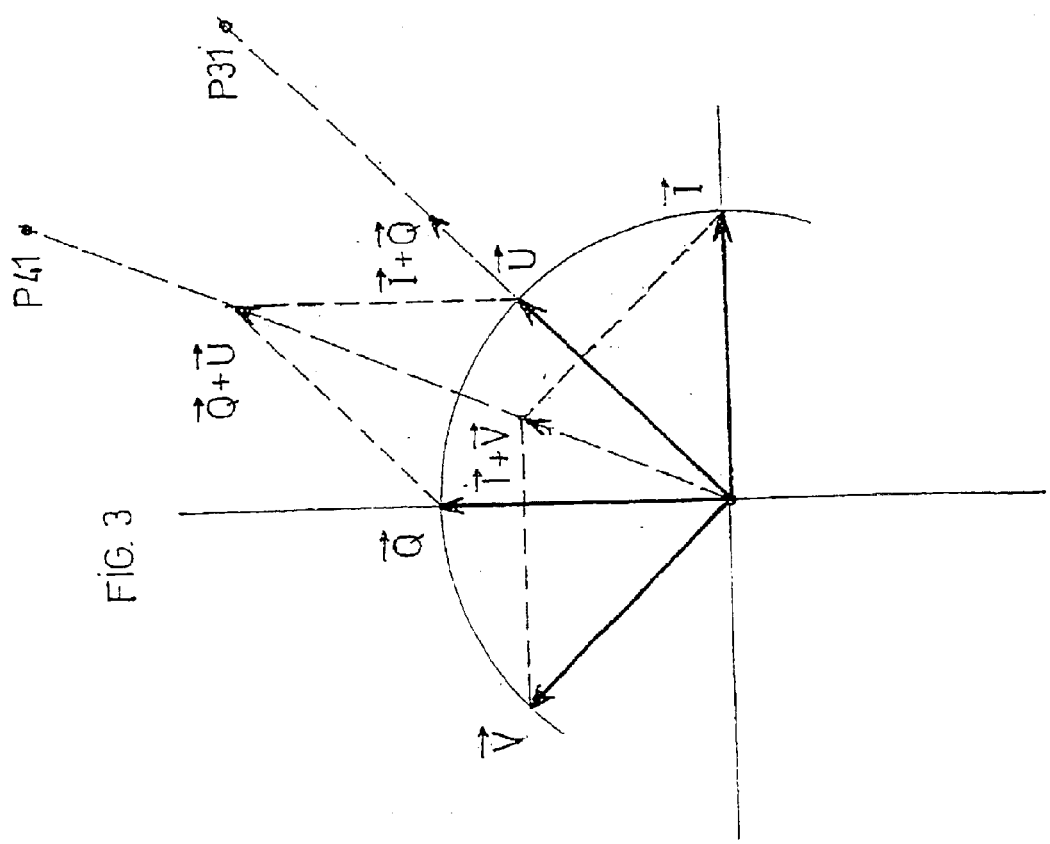

Other objects, features and advantages of the invention will become apparent on reading the following description, which refers to the appended figures in which:

FIG. 1 is basic scheme of a modulator circuit according to the invention,

FIG. 2 is a scheme of an exemplary embodiment of a modulator circuit according to one embodiment of the invention with a distributed structure having four branches, FIG. 3 is a Fresnel diagram illustrating an exemplary vector construction in the complex plane of the modulated output signal of the circuit in FIG. 2, FIG. 4 is a Fresnel diagram illustrating the various points in the Fresnel complex plane that can be addressed by the circuit in FIG. 2, and an exemplary application of the invention for producing 16-PSK modulation, FIG. 5 is identical to FIG. 4, but represents another exemplary application of the invention for producing 16-QAM modulation.

FIG. 1 represents a modulator circuit 1 according to the invention receiving an input signal, referred to as a carrier signal $Se=A \cdot \sin(\overline{\omega}e.t+\Phi e)$, and a modulation signal SCj which is a digital signal or represents a digital signal, and delivering a modulated output signal $Ss=A' \cdot \sin(\overline{\omega}s.t+\Phi s)$. In the case of phase-shift keying (PSK) modulation, the modulated output signal Ss is phase-modulated as a function of the digital modulation signal SCj, for example of the NRZ type. In general, $\overline{\omega}s=\overline{\omega}e$.

The modulator circuit 1 according to the invention comprises at least one phase-shift keying modulation cell CMi, of the type intended to receive two digital control signals SCji1, SCji2 representing at least a part of the digital modulation signal SCj.

Such a modulation cell CMi may be formed by a traditional BPSK modulation cell with two phase states in opposition and a single amplitude state (when the digital control signals are complementary). Such a modulation cell CMi is described, for example, in the publication A. PRIMEROSE et al. cited above (FIG. 3b) and comprises two switches formed by field-effect transistors and two input filters, namely a low-pass filter inducing a phase shift of −90° and a high-pass filter inducing a phase shift of +90°. As a variant, or in combination, it is also possible to use a BPSK modulation cell as described in WO/98.38730 (FIG. 7).

These BPSK modulation cells are nevertheless modified so that digital control signals SCji1, SCji2 of simultaneously identical values can be applied to them. In the case of a cell from the publication A. PRIMEROSE et al., these digital control signals are formed by the voltages Vg and $\overline{V}g$, respectively. In the case of the cell from WO/98.38730 (FIG. 7), the digital control signals SCji1 and SCji2 are applied according to the invention to the gates of the switching transistors CO0 and CO1, respectively, instead of the complementary signals formed from the modulation signal in this circuit.

The modulator circuit 1 according to the invention furthermore comprises input impedance matching means 2, via which an input signal SDi coming from the carrier signal Se is delivered to the cell CMi with a view to modulating it. This input signal SDi is obtained directly or indirectly (via input circuits which may or may not participate in the modulation and, in particular, may or may not comprise one or more other modulation cell(s)). These input impedance matching means 2 make it at least substantially possible to ensure impedance matching of the modulation cell CMi irrespective of the values of the control signals SCji1, SCji2 which are applied to it, that is to say whether they are complementary or equal.

These impedance matching means 2 contain a transistor 3—especially a field-effect transistor, in particular a PHEMT (on GaAs)—receiving the input signal SDi on the gate, having its source connected to ground and its drain supplying a capacitor 4 which is connected to the input 5 of the modulation cell CMi, and a parallel resistor 6 connected between the input 5 of the modulation cell CMi and ground. As a variant, the transistor 3 may be a bipolar transistor.

The transistor 3 and the capacitor 4 isolate the modulation cell CMi from the input of the circuit 1, so that the carrier signal Se is not perturbed by the modulation.

The parallel resistor 6 is selected so as to have an impedance corresponding to that of the modulation cell CMi when the control signals SCji1, SCji2 are complementary, in particular of the order of 50 Ω. In this way, the input impedance of the modulation cell CMi remains of the order of this impedance, in particular of the order of 50 Ω (between 10 Ω and 100 Ω).

The output impedance should also be matched for the various values of the digital control signals. This is obtained in practice by the fact that the modulated elementary signal Ssi delivered by the modulation cell CMi is generally combined in phase with the other signals coming from other modulation cells CMi by one or more Wilkinson couplers (in phase power couplers) which have the effect of masking the impedance imbalances between modulation cells CMi in parallel.

As a variant, it is also possible to duplicate the input impedance matching means 2 symmetrically at the output by connecting the output Ssi to a parallel resistor (to ground) and to the gate of a field-effect transistor whose source is grounded. It is also possible to use a bipolar transistor.

The modulator circuit 1 according to the invention comprises transcoding means 7 capable of generating the digital control signals SCji1, SCji2 of each modulation cell CMi from the digital modulation signal SCj. These transcoding means 7 are formed by a simple logic table programmed into a logic circuit designed for this purpose. For certain values of the modulation signal SCj, the control signals SCji1, SCji2 of at least one modulation cell CMi are identical (both equal to 0 or to 1). Preferably, not all the control signals SCji1, SCji2 of all the modulation cells CMi are identical simultaneously, the modulation not using the origin of the Fresnel plane as an active point.

In practice, all of the modulator circuit 1 according to the invention, apart from the transcoding means 7 and the impedance matching means 2, may consist of a traditional modulator, in particular a distributed-structure circuit as described by WO/98.38730, comprising a distribution line 8 forming similar phase-shift cells end-to-end in a ladder defining junction nodes of derived branches Bi. Each derived branch Bi comprises at least one modulation cell CMi. The distribution line 8 comprises, for example, similar series inductors Li between an input capacitor 9 and a termination device 10, and field-effect transistors Ti—in particular MESFETs (on GaAs)—connected to the nodes Ni by their gate, to ground by their source and whose drain forms a derived branch Bi. The transistor Ti fulfills the function of a transistor 3 of the impedance matching means 2 of a modulation cell CMi belonging to the derived branch Bi.

The modulator circuit 1 preferably comprises more than two derived branches Bi. Each derived branch Bi may furthermore be a simple line comprising such a modulation cell CMi (each branch Bi then delivering a branch-output signal Ssi formed by the modulated elementary signal Ssi delivered by the modulation cell CMi) or, conversely, it may itself be a distributed-structure circuit, the modulator circuit 1 being formed by a tree with a plurality of interleaved distributed structures.

FIG. 2 represents an exemplary embodiment with four derived branches B1, B2, B3, B4, each comprising a modulation cell CM1, CM2, CM3, CM4, the distribution line 8 comprising four inductors L1, L2, L3, L4 and four transistors T1, T2, T3, T4 delivering the input signals SD1, SD2, SD3, SD4 to each branch. Each modulation cell CM1, CM2, CM3, CM4 delivers a modulated elementary signal Ss1, Ss2, Ss3, Ss4 sent via an isolating capacitor 11 at its output to a double stage 12 of Wilkinson couplers adding in phase these modulated elementary signals (which are also the branch-output signals) in order to from the modulated output signal Ss.

Since the modulation signal SCj is a digital signal over four bits ABCD, the transcoding means 7 construct the control signals SCji1, SCji2 of the modulation cells CMi according to the constellation which is intended to be used for the modulation protocol. If the input signals SDi are mutually phase-shifted by 45° (by the distribution line 8) and are respectively formed by the vectors $\overline{IU}\overline{QV}$ as represented in FIG. 3, the transcoding means 7 may be arranged according to the following logic table in order to address the 16 points P 31 to P 38; P 41 to P 48 of the larger-amplitude constellation represented in FIG. 4. A circuit with 16 phase states (16-PSK) is then obtained in an extremely simple and reliable way.

values of the control signals SCji1, SCji2 of the four derived branches, by integrating therein the pairs of identical values (0, 0) and/or (1, 1). Preferably, as in the table mentioned above, use is made only of the pair (0, 0) and not the pair (1, 1), which is capable of generating larger technological drifts.

All the points of the constellation in FIGS. 4 and 5 can be addressed for phase-shifted keying and/or amplitude modulation.

The invention is capable of various alternative embodiments in relation to the nonlimiting examples described above and represented.

It is advantageously applicable to the production of a modulator circuit in the microwave range (classically from 1 GHz to 300 GHz) where the propagation phenomena are

| Modulation signal | | | | Control signals | | | | | | | | Branch-output signals | | | | |
|---|---|---|---|---|---|---|---|---|---|---|---|---|---|---|---|---|
| A | B | C | D | SCj 11 | SCj 12 | SCj 21 | SCj 22 | SCj 31 | SCj 32 | SCj 41 | SCj 42 | Ss1 | Ss2 | Ss3 | Ss4 | Points |
| 0 | 0 | 0 | 0 | 0 | 1 | 0 | 1 | 0 | 1 | 0 | 1 | 1 | U | Q | V | P41 |
| 0 | 0 | 1 | 0 | 1 | 0 | 0 | 1 | 0 | 1 | 0 | 1 | -1 | U | Q | V | P42 |
| 0 | 1 | 0 | 0 | 1 | 0 | 1 | 0 | 0 | 1 | 0 | 1 | -1 | -U | Q | V | P43 |
| 0 | 1 | 1 | 0 | 1 | 0 | 1 | 0 | 1 | 0 | 0 | 1 | -1 | -U | -Q | V | P44 |
| 1 | 0 | 0 | 0 | 1 | 0 | 1 | 0 | 1 | 0 | 1 | 0 | -1 | -U | -Q | -V | P45 |
| 1 | 0 | 1 | 0 | 0 | 1 | 1 | 0 | 1 | 0 | 1 | 0 | 1 | -U | -Q | -V | P46 |
| 1 | 1 | 0 | 0 | 0 | 1 | 0 | 1 | 1 | 0 | 1 | 0 | 1 | U | -Q | -V | P47 |
| 1 | 1 | 1 | 0 | 0 | 1 | 0 | 1 | 0 | 1 | 1 | 0 | 1 | U | Q | -V | P48 |
| 0 | 0 | 0 | 1 | 0 | 1 | 0 | 1 | 0 | 1 | 0 | 0 | 1 | U | Q | 0 | P31 |
| 0 | 0 | 1 | 1 | 0 | 1 | 0 | 1 | 0 | 0 | 1 | 0 | 1 | U | 0 | -V | P32 |
| 0 | 1 | 0 | 1 | 0 | 1 | 0 | 0 | 1 | 0 | 1 | 0 | 1 | 0 | -Q | -V | P33 |
| 0 | 1 | 1 | 1 | 0 | 0 | 1 | 0 | 1 | 0 | 1 | 0 | 0 | -U | -Q | -V | P34 |
| 1 | 0 | 0 | 1 | 1 | 0 | 1 | 0 | 1 | 0 | 0 | 0 | -1 | -U | -Q | 0 | P35 |
| 1 | 0 | 1 | 1 | 1 | 0 | 1 | 0 | 0 | 0 | 0 | 1 | -1 | -U | 0 | V | P36 |
| 1 | 1 | 0 | 1 | 1 | 0 | 0 | 0 | 0 | 1 | 0 | 1 | -1 | 0 | Q | V | P37 |
| 1 | 1 | 1 | 1 | 0 | 0 | 0 | 1 | 0 | 1 | 0 | 1 | 0 | U | Q | V | P38 |

The points P41 to P48 are those obtained traditionally when the control signals SCji1, SCji2 are complementary. The points P31 to P38 are obtained with identical control signals on one of the branches. FIG. 3 illustrates the exemplary vector construction of the points P31 and P41.

As seen in FIG. 4, the number of points of the constellation can be at least doubled in an extremely simple and economical way by simple logic programming of the coding table, without structural modification of the circuit. It should be noted that the theoretical amplitude of the points P31 to P38 is 0.7 dB less than that of the points P41 to P48. Instead of the two constellations of 8 points (two times eight phase states, with different amplitudes) obtained in the circuit of WO/98.38730, 80 points are thus obtained with the invention (the origin generally being excluded), and in particular 8 additional points whose amplitude is of the same order (only 0.7 dB less than) as that of the large constellation of the circuit in WO/98.38730, but which are phase-shifted by 22.5° relative to these points, so that a constellation of 16 phase states is available with an amplitude precision that is acceptable for high-performance coding systems such as MTCM (multidimensional trellis coded modulation).

FIG. 5 represents an exemplary constellation formed by 16 points A1, A2, A3, A4, A5, A6, A7, A8, A9, A10, A11, A12, A13, A14, A15, A16, making it possible to produce 16-QAM modulation with acceptable precision.

In the various cases, it is possible to reduce the theoretical inaccuracies by using a power amplifier in its compression zone upstream.

FIGS. 4 and 5 represent all the points ($3^4-1=80$ points in addition to the origin) that can be obtained according to the important, and in monolithic microwave MMIC technology—in particular on gallium arsenide—. It is also applicable to the production of modulator circuits in all frequency ranges.

In order to be compatible with the working frequencies of digital circuits, the modulation signal SCj generally has a frequency less than that ($\overline{\omega}e/2\pi$) of the carrier signal. For example, if $\overline{\omega}e/2\pi$ is in the microwave range, the frequency of the modulation signal SCj may be of the order of 100 MHz.

What is claimed is:

1. A method for modulating a periodic carrier signal (Se) with a digital modulation signal (SCj), implemented by a modulator circuit (1) comprising at least one modulation cell (CMi) intended to receive two digital control signals (SCji1, SCji2) capable of being equal to 0 or to 1, representing at least a part of the digital modulation signal (SCj), in which, for at least one value of the digital modulation signal (SCj), two digital control signals (SCji1, SCji2) of equal value are applied to at least one given modulation cell (CMi) and, for at least one other value of the digital modulation signal (SCj), two digital control signals (SCji1, SCji2) of complementary values are applied to this (these) modulation cell(s) (CMi).

2. The method as claimed in claim 1, wherein at least one modulation cell (CMi) receiving two digital control signals (SCji1, SCji2) of equal value for at least one value of the digital modulation signal (SCj) is designed to deliver a signal, referred to as a modulated elementary signal (Ssi), which is zero for this value of the digital modulation signal (SCj).

3. The method as claimed in claim 1, wherein at least one modulation cell (CMi) is a phase-shift keying modulation cell.

4. The method as claimed in claim 1, wherein at least one modulation cell (CMi) is designed to deliver a modulated elementary signal (Ssi) with two phase states in opposition and a single amplitude state when it receives complementary digital control signals (SCji1, SCji2), and to deliver a modulated elementary signal (Ssi) which is zero when it receives digital control signals (SCji1, SCji2) of equal value.

5. The method as claimed in claim 4, wherein, when the two digital control signals (SCji1, SCji2) are of equal value, they are both equal to 0.

6. The method as claimed in claim 1, wherein the modulator circuit (1) comprises at least two modulation cells (CMi), and wherein, for at least one value of the digital modulation signal (SCj), two digital control signals (SCji1, SCji2) of equal value are applied to at least one modulation cell (CMi) and two digital control signals (SCji1, SCji2) of complementary values are applied to at least one other modulation cell (CMi).

7. The method as claimed in claim 1, wherein, an input signal (SDi) coming from the carrier signal (Se) is delivered to each modulation cell (CMi) via impedance matching means (7), which are designed so that the modulation cell (CMi) is at least substantially impedance-matched both when the digital control signals (SCji1, SCji2) that it receives are complementary and when they are equal.

8. The method as claimed in claim 7, wherein the impedance matching means (7) comprise, for each modulation cell (CMi), a transistor (3), which receives the input signal (SDi) and is connected to the modulation cell (CMi), and a parallel resistor (6) between the transistor (3) and ground.

9. The method as claimed in claim 1, wherein a modulator circuit (1) is used with a distributed structure comprising a plurality of derived branches (Bi), each comprising at least one modulation cell (CMi) intended to receive two digital control signals (SCji1, SCji2), each derived branch (Bi) delivering a signal referred to as a modulated branch-output signal (Ssi), and wherein the modulated branch-output signals (Ssi) coming from the various derived branches (Bi) are added in phase in order to form a modulated output signal (Ss).

10. A modulator circuit capable of modulating a periodic carrier signal (Se) with a digital modulation signal (SCj), comprising at least one modulation cell (CMi) intended to receive two digital control signals (SCji1, SCji2) capable of being equal to 0 or to 1, representing at least a part of the digital modulation signal (SCj), this circuit being designed so that, for at least one value of the digital modulation signal (SCj), at least one given modulation cell (CMi) receives two digital control signals (SCji1, SCji2) of equal value, and so that, for at least one other value of the digital modulation signal (SCj), this (these) modulation cell(s) (CMi) receives two digital control signals (SCji1, SCji2) of complementary values.

11. The circuit as claimed in claim 10, wherein at least one modulation cell (CMi) receiving two digital control
signals (SCji1, SCji2) of equal value for at least one value of the digital modulation signal (SCj) is designed to deliver a signal, referred to as a modulated elementary signal (Ssi), which is zero for this value of the digital modulation signal (SCj).

12. The circuit as claimed in claim 10, wherein at least one modulation cell (CMi) is a phase-shift keying modulation cell.

13. The circuit as claimed in claim 10, wherein at least one modulation cell (CMi) is designed to deliver a modulated elementary signal (Ssi) with two phase states in opposition and a single amplitude state when it receives complementary digital control signals (SCji1, SCji2), and to deliver a modulated elementary signal (Ssi) which is zero when it receives digital control signals (SCji1, SCji2) of equal value.

14. The circuit as claimed in claim 13, wherein, when the two digital control signals (SCji1, SCji2) are of equal value, they are both equal to 0.

15. The circuit as claimed in claim 10, wherein it comprises at least two modulation cells (CMi), and is designed so that, for at least one value of the digital modulation signal (SCj), at least one modulation cell (CMi) receives two digital control signals (SCji1, SCji2) of equal value and at least one other modulation cell (CMi) receives two digital control signals (SCji1, SCji2) of complementary values.

16. The circuit as claimed in claim 10, wherein it comprises, upstream of each modulation cell (CMi), impedance matching means (7) which supply the modulation cell (CMi) with an input signal (SDi) coming from the carrier signal (Se) and which are designed so that the modulation cell (CMi) is at least substantially impedance-matched both when the digital control signals (SCji1, SCji2) that it receives are complementary and when they are equal.

17. The circuit as claimed in claim 16, wherein the impedance matching means (7) comprise, for each modulation cell (CMi), a transistor (3), which receives the input signal (SDi) and is connected to the modulation cell (CMi), and a parallel resistor (6) between the transistor and ground.

18. The circuit as claimed in claim 10, wherein it has a distributed structure comprising a plurality of derived branches (Bi), each comprising at least one modulation cell (CMi) intended to receive two digital control signals (SCji1, SCji2), each derived branch (Bi) delivering a signal referred to as a modulated branch-output signal (Ssi), and means (12) for adding in phase the modulated branch-output signals (Ssi) coming from the various derived branches (Bi) in order to form a modulated output signal (Ss).

* * * * *